United States Patent
Clinton

(10) Patent No.: US 7,936,624 B2
(45) Date of Patent: May 3, 2011

(54) REDUCED POWER BITLINE PRECHARGE SCHEME FOR LOW POWER APPLICATIONS IN MEMORY DEVICES

(75) Inventor: Michael Patrick Clinton, Allen, TX (US)

(73) Assignee: Texas Instruments Incorporated, Dallas, TX (US)

(*) Notice: Subject to any disclaimer, the term of this patent is extended or adjusted under 35 U.S.C. 154(b) by 383 days.

(21) Appl. No.: 11/965,517

(22) Filed: Dec. 27, 2007

(65) Prior Publication Data

US 2008/0181038 A1    Jul. 31, 2008

Related U.S. Application Data

(60) Provisional application No. 60/882,914, filed on Dec. 30, 2006.

(51) Int. Cl.
*G11C 7/00* (2006.01)

(52) U.S. Cl. ......................................................... 365/203
(58) Field of Classification Search .................... 365/203
See application file for complete search history.

(56) References Cited

U.S. PATENT DOCUMENTS 4,852,064 A * 7/1989 Kim et al. ....................... 365/203
6,631,093 B2 * 10/2003 Kumar et al. .................. 365/203

* cited by examiner

*Primary Examiner* — VanThu Nguyen
(74) *Attorney, Agent, or Firm* — Dawn V. Stephens; Wade James Brady, III; Frederick J. Telecky, Jr.

(57) ABSTRACT

A method and system are described for a two step precharging of bitlines in a memory array. In the first step a partial precharge of the bitline is accomplished with a lower power supply, the second step completes the bitline precharge with the higher power supply. Since the higher power supply must ultimately supply the final bitline precharge voltage achieving a partial bitline precharge with a lower power supply will result in lower sram and system power.

20 Claims, 3 Drawing Sheets

REDUCED POWER BITLINE PRECHARGE SCHEME FOR LOW POWER APPLICATIONS IN MEMORY DEVICES

RELATED APPLICATIONS

The present application claims priority under 35 U.S.C. §119(e) to U.S. Provisional Application No. 60/882,914 filed Dec. 30, 2006, the disclosure of which is incorporated herein.

BACKGROUND

A considerable portion of portable electronic devices, such as cellular telephones, are memory devices. Therefore, a goal in the semiconductor and electronics industry is to make memory devices in portable electronic devices, smaller and consume less power. For example, a challenge is to support trends to smaller sized memory devices, such as the trend from "65 nm" technology bit cells to "45 nm" technology bit cells. Since portable electronic devices rely almost exclusively on battery power, components such as memory devices should be power efficient, minimizing power consumption and power dissipation.

Semiconductor memories or memory devices can be characterized as volatile random access memories (RAMs) or nonvolatile read only memories (ROMs), where RAMs can include static RAM (SRAM) and dynamic RAM (DRAM). In general, SRAM and DRAM differ in the way they store a state of a bit in a bit cell of the memory. In SRAM, each bit cell can include circuitry (typically a transistor circuit) that implements a bi-stable latch. Such a transistor circuit can rely on transistor gain and positive feedback, where one of two possible states are assumed, i.e., "ON" or state 1, or "OFF" or state 2. An application of voltage to the bi-stable latch induces the state to change from one to the other. This allows a state written to a bit cell to be retained until the bit cell is reprogrammed.

An SRAM may be arranged as a matrix of memory or bit cells fabricated in an integrated circuit (IC) chip, where address decoding in the IC chip allows access to each bit cell for read/write functions. SRAM bit cells can include active feedback from cross-coupled inverters in the form of a latch to store or "latch" a bit of information. These SRAM bit cells can be arranged in rows, such that blocks of data (e.g., words, bytes, etc.) can be written or read simultaneously.

A particular challenge in memory device technology in general, and SRAM in specific, is variability in process and manufacture of memory devices. For example, there can be significant variances in the bit cells of SRAM devices that affect performance. The variances may further be complicated due to actual operating temperature changes.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In an embodiment, a static random access memory (SRAM) device includes multiple bit cells connected to bitlines and wordlines, and a first precharge device to perform partial precharging of the bitlines with a first power supply and a second precharge device to complete precharging of the bitlines with a second power supply.

BRIEF DESCRIPTION OF THE CONTENTS

DETAILED DESCRIPTION

An exemplary system and methods for implementing reduced power consumption in a static random access memory (SRAM) device are described. The exemplary system and methods include providing separate precharge signals to bitlines connected to bit cells arranged in matrix or array of a SRAM device. The system and methods may be included in or part of a portable electronic device, for example a wireless communication device, such as a cellular telephone.

Figure 1:
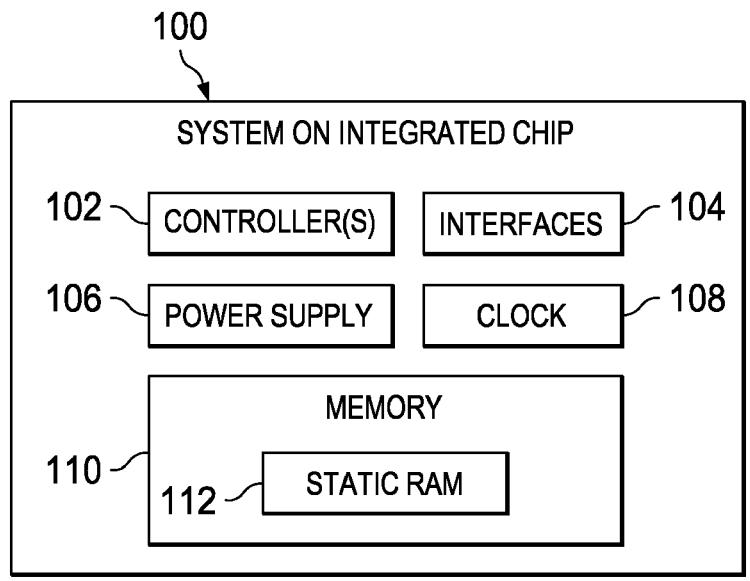
FIG. 1 is a block diagram illustrating an exemplary system that supports reduced power bitline precharge for a SRAM memory device.

FIG. 1 shows an exemplary system 100. In this example, system 100 is a system on an integrated chip or SOIC. Although, the system 100 is discussed in reference to distinct blocks or components, it is to be appreciated that other implementations may combine such components or functions of such components, rely on functionality from other components (either internal or external to system 100), forego particular components and/or functionality, and so on.

System 100 includes one or more processors or controllers 102. An example of such controllers 102 is SmartReflex™ technology offered by the Texas Instruments® Corporation. Controllers 102, such as SmartReflex™ controllers may implement a feedback and control system to monitor temperature and operation of system 100 and its components. In other words, controllers 102 may include intelligent and adaptive hardware and software techniques that dynamically control voltage, frequency, and power based on device activity, modes of operation and temperature. Furthermore, controllers 102 are coupled to and may be configured to monitor and provide intra and inter communications, and to regulate power in the system 100. Interfaces 104 may be provided to support such communications. Interfaces 104 may include various communication input/output interfaces and communication busses or lines.

The exemplary system 100 includes a power supply 106 which may be a component that receives power from an external source and stores the power to be used by system 100. Power supply 106 can include a regulated voltage or current supply. The system 100 can include a clock 108 used for various timing operations by system 100.

System 100 includes a memory component or memory 100. Memory 100 can include volatile and non volatile memory, such as ROM and RAM memory. Memory 100 is particularly accessed and controlled by controllers 102, and interfaces with other components in system 100. In particular, memory 110 receives power from power supply 106, communicates with or through interfaces 106, and receives clock or timing signals from clock 108. Memory 100 includes a static random access memory (SRAM) device or component, hereinafter referred to as SRAM 112.

As discussed below, SRAM 112 may be configured as an array of bit cells. SRAM 112 may implement a particular size technology, such as 65 nm technology as known in the industry.

Figure 2:
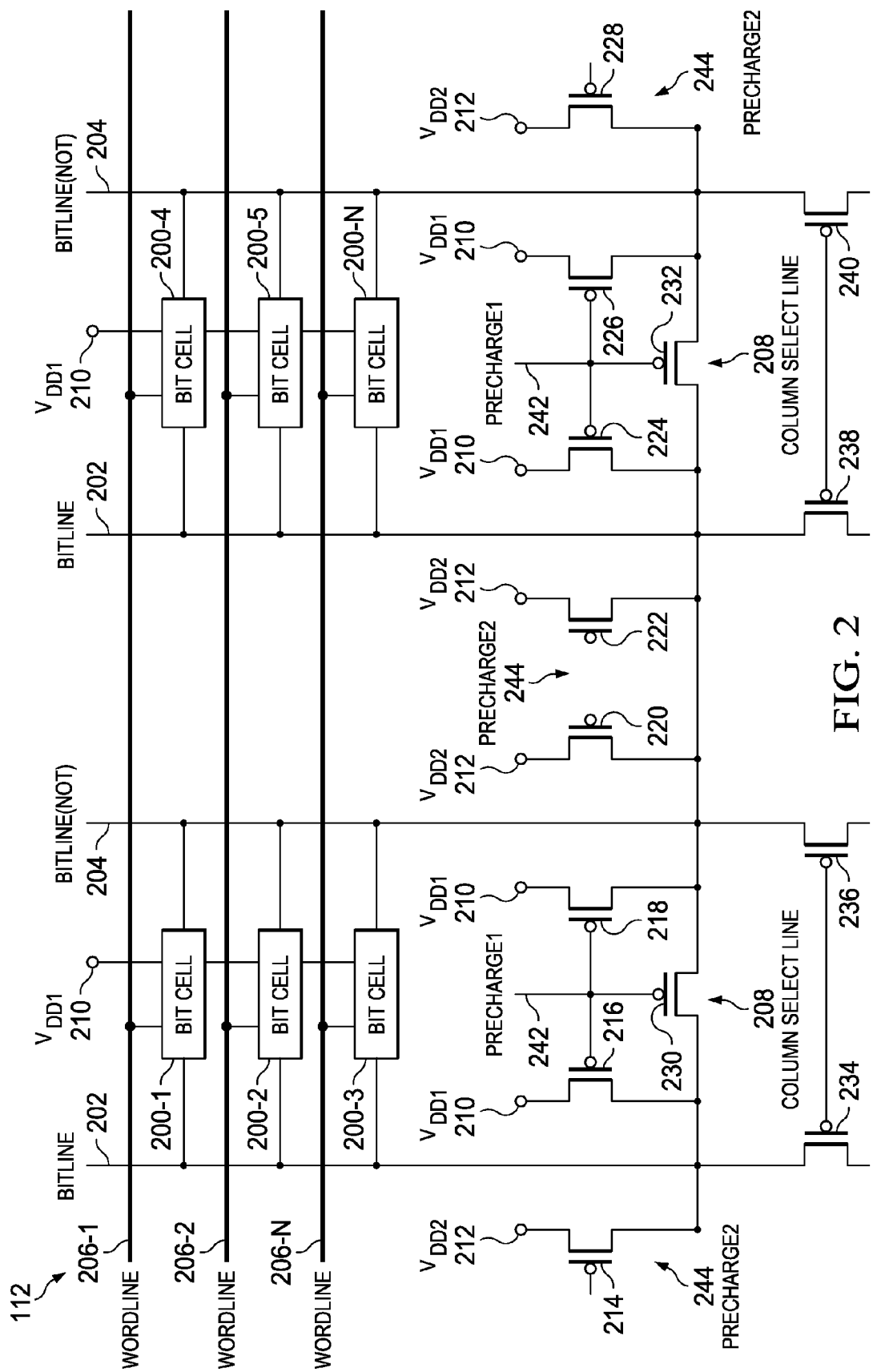
FIG. 2 is a block diagram illustrating an exemplary precharged bit cell array in a SRAM memory device.

FIG. 2 shows an exemplary SRAM 112 configuration. SRAM 112 includes an array of bit cells 200. It is to be understood, that the array of bit cells 200 includes other bit cells not shown, and that SRAM 112 configuration includes other components. The components that are shown are illustrative of other like components that are not shown. The bit cells 200 are connected by bitline 202 and complementary or NOT bitline 204, and various wordlines 206. The array of bit cells also includes a column select line 208 that selects bit lines (e.g., bitline 202 and bitline (NOT) 204).

For 65 nm technology node and future nodes (i.e., 45 nm technology and beyond), a SRAM bit cell 200 may not be able to operate reliably at voltages below 1.0 volt. A solution can be to operate the SRAM 112 with two different supply voltages (i.e., split-rail or dual-rail). In split-rail operation the chip logic (e.g., controllers 102) and the SRAM 112 periphery are allowed to operate from a power supply (e.g., power supply 106) which can go well below 1.0 volt. The SRAM 112 array of bit cells 200, operates from a supply which will not go below 1.0 volt, or whatever the minimum operating voltage of the SRAM bit cell 200 happens to be. However, many wireless applications cannot afford two supplies, so the SRAM array voltage is typically generated on chip from an available 1.8 volt supply by use of a low dropout regulator. In other words, a 1.8 volt supply is used for the I/O circuits.

Corresponding to a power point of view, current sourced from the SRAM 112 array supply is multiplied by 1.8 volts, whereas current sourced from the lower 1.0 volt or lower supply is multiplied by 1.0 volt or lower, depending on the value of this power supply. For low power applications as much of current load as possible is moved to the chip/SRAM periphery supply.

A precharge voltage is required to precharge the bitlines 202 and 204. As size of SRAM 112 decreases to a 45 nm technology node, the SRAM bit cell 200 may need very precise control of biases applied to terminals of the bit cell 200. In the system we have described, the bit cell array uses a power supply $V_{DD1}$ 210 which may not go below 1.0v for example so that proper operation of the SRAM bit cell 200 can be guaranteed. On the other hand, the rest of the SRAM periphery may use a power supply $V_{DD2}$ 212 which may be equal to the power supply $V_{DD1}$ 210 or well below the power supply $V_{DD1}$ 210. The bitlines 202 and 204 may not be precharged with the power supply $V_{DD2}$ 212 due to the necessity of precise bit cell bias control and the wide range of values of power supply $V_{DD2}$ 212.

In this example, $V_{DD1}$ 210 may be a generated 1.8 volt power supply, such as power supply 106. In addition to $V_{DD1}$ 210, a lower value power supply $V_{DD2}$ 212 is provided which may be 1.0 volts. Therefore, in this implementation there is a higher value (1.8 volt) power supply in $V_{DD1}$ 210 and a lower value ($\leq 1.0$ volt) power supply in $V_{DD2}$ 212. $V_{DD2}$ 212 may be a power supply provided or regulated by controller(s) 102. In particular applications, a SmartReflex™ controller may provide such regulated lower value power.

$V_{DD2}$ 212 may be used to provide an initial precharge voltage to the bitlines 202 and 204, and $V_{DD1}$ 210 is used to complete the final precharge of said bitlines. The total precharge is made to the bitlines 202 and 204 to a level which is precisely the array supply $V_{DD1}$ 210. If only the array supply $V_{DD1}$ 210 supplies the bitline 202 and 204 precharge current, higher power dissipation may result.

In this example, an additional bitline precharge devices may be added to each bitline 202 and 204. These additional bitline precharge devices can be connected to an IC or SRAM periphery power supply (i.e., power supply 106), and these devices will pulse on after the wordline has shut off. After the bitlines 202 and 204 or bit cells 200 have been precharged with the chip/SRAM periphery voltage or $V_{DD2}$ 212, the other precharge devices and equalize device turn on as normal.

In this implementation, the precharge devices for a particular pair of bitlines 202 and 204 are made up of MOSFETs 214, 216, 218, 220, and 230. Particular MOSFETs will be described as making up exemplary precharge devices in the SRAM 112. It will be apparent, that other MOSFETs shown in FIG. 2 make up similar precharge devices and perform similar functions. In this example, MOSFETs 234, 236, 238, and 240 are used to provide column select line 208 to select a particular bitline pair 202 and 204.

For example, a higher voltage precharge device, to provide a PreCharge1 current or PreCharge1 242, includes MOSFETs 216 and 218. MOSFETs 216 and 218 are particularly charged by higher value $V_{DD1}$ 210. A lower voltage precharge device, to provide a PreCharge2 current or PreCharge2 244 includes MOSFETs 214 and 220. MOSFETs 214 and 220 are particularly charged by lower value $V_{DD2}$ 212. In operation, the lower voltage precharge device is activated first to provide a current to enable initial bitline precharge, and the higher voltage precharge device is activated to supply whatever remaining current may be needed for precharging the bitlines 202 and 204. MOSFET 230 is used as an equalize device to ensure bitline 202 and bitline (NOT) 204 have exactly the same final precharge voltage.

Figure 3:
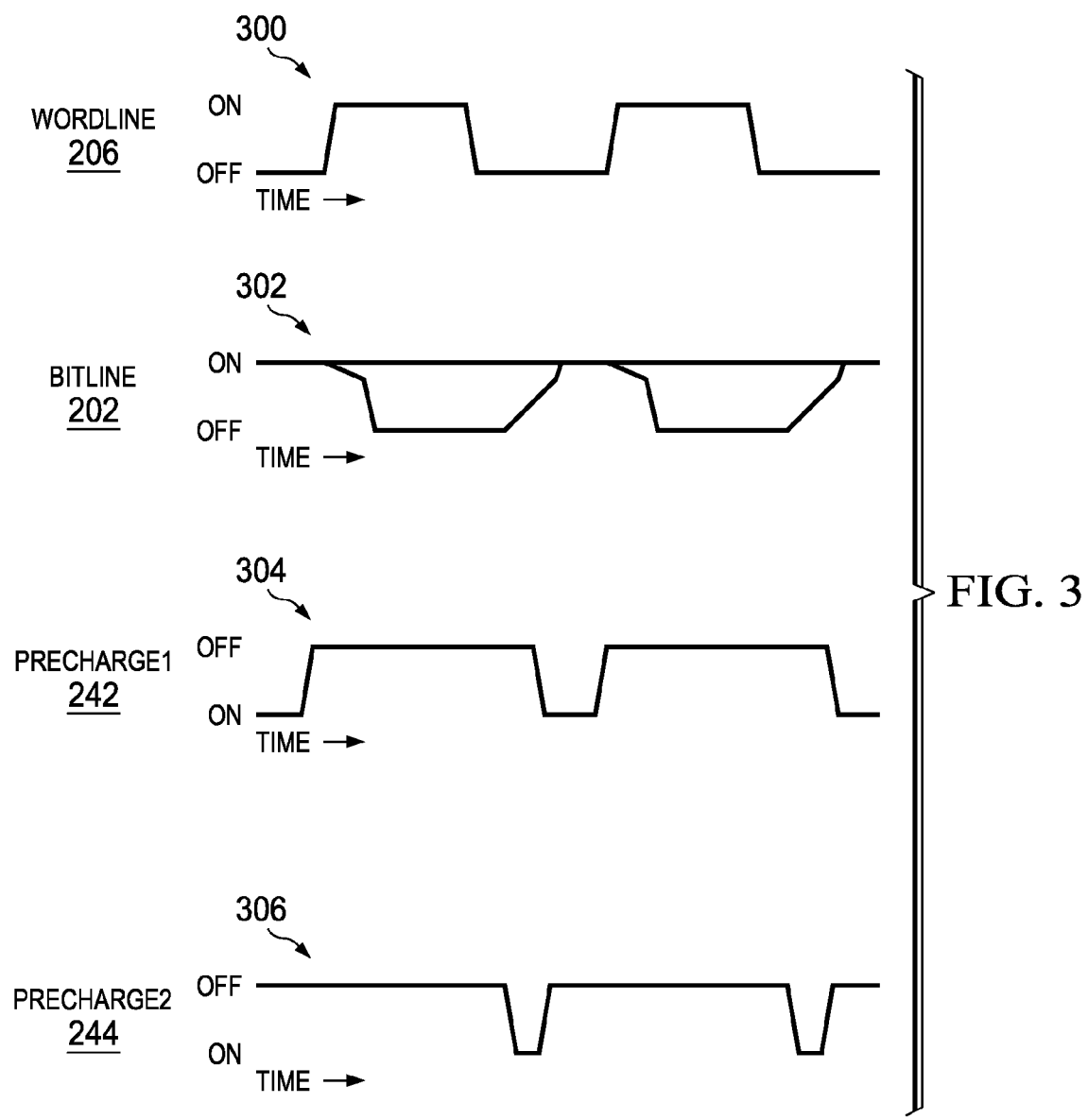
FIG. 3 are timing diagrams illustrating wordline, bitline, precharge1, precharge2 activation in a SRAM memory device.

FIG. 3 shows timing diagrams for activation of Wordline 206, Bitline 202, PreCharge1 242, and PreCharge2 244. In particular, timing diagram 300 represents Wordline 206; timing diagram 302 represents Bitline 202; timing diagram 304 represents PreCharge1 242; and timing diagram 306 represents PreCharge2 244. As illustrated by the timing diagrams of FIG. 3, PreCharge1 is low or "ON" until the bitlines are accessed and made high or "OFF". This turns off the precharge devices, and allows the Wordline 206 to turn "ON", and develop a signal differential on Bitlines 202 and 204. After the Wordline 206 is turned off, the discharged Bitline 202 or 204 is precharged back up. As illustrated, PreCharge2 244 pulses or turns "ON" to provide a majority of the current injecting for precharging, and PreCharge1 242 is used to complete the precharging and maintain the precharge level on Bitlines 202 and 204 until the next Wordline 206 activation.

Figure 4:
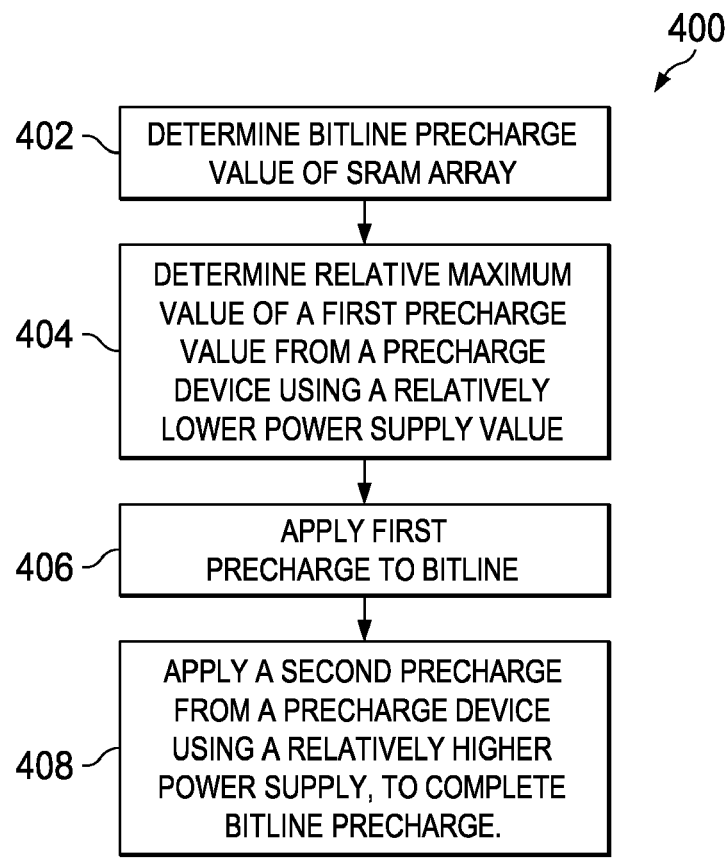
FIG. 4 is a flowchart illustrating a process to support reduced power bitline precharge for a SRAM memory device.

FIG. 4 shows a process 400 that provides for precharging bitlines in SRAM memory device.

The process 400 is illustrated as a collection of blocks in a logical flow graph, which represent a sequence of operations that can be implemented in hardware such as described above. Although described as a flowchart, it is contemplated that certain blocks may take place concurrently or in a different order.

At block 402, a determination is made as to a precharge value for bitlines in bit cell array of a SRAM memory device. This value may be an existing array $V_{DD}$ voltage value or a value below the array $V_{DD}$ voltage. Consideration may also be made as to temperature, speed, and efficiency in determining the precharge value.

At block 404, determination is made as to a value that a first precharge device can provide. The first precharge device derives a precharge value from a voltage supply that may be lower than the array $V_{DD}$ voltage value. The voltage supply may be directed or from a controller, such as SmartReflex™ controller that may take into account process variations of the physical SRAM memory device, along with temperature during operation.

At block 406, the first precharge value is applied to all of the bitlines in the SRAM memory device. Every bitline will have a corresponding first precharge device made up of MOSFETs as described above.

At block 408, to complete the bitline precharge, a second precharge and an equalize operation is applied or performed on the bitlines. This second precharge is derived from a second precharge device that relies on a higher voltage value, such as existing array $V_{DD}$ voltage value. Only the necessary voltage is used to make up for the precharge deficiency provided by the first precharge device.

CONCLUSION

The above-described systems and methods describe precharging bitlines of array bit cells in a SRAM memory device. Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention.

What is claimed is:

1. A system comprising:
    a controller; and
    a memory coupled to the controller, comprised of:
        a static random access memory (SRAM) device that includes multiple bit cells connected to bitlines and wordlines; and a first precharge device to perform partial precharge of the bitlines and a second precharge device to complete the precharge of the bitlines
        wherein the first precharge device accesses a lower voltage supply and the second precharge device accesses a higher voltage supply.

2. The system of claim 1, wherein the controller implements a feedback and control to monitor temperature and process variance of the system and the SRAM device.

3. The system of claim 1, wherein the controller provides a regulated voltage to the first precharge device.

4. The system of claim 1, wherein the multiple bit cells are arranged in an array, and the first precharge device and the second precharge device are dedicated to a column of the array.

5. The system of claim 1, wherein the first precharge device accesses a lower voltage supply and the second precharge device accesses a higher voltage supply.

6. The system of claim 1, wherein the first precharge device and the second precharge device are comprised of MOSFETs.

7. The system of claim 1 implemented in a portable electronic device.

8. A static random access memory (SRAM) device comprising:
    an array of bit cells,
    one or more wordlines connected to the array of bit cells;
    one or more bitlines connected to the array of bit cells;
    a first precharge device that provides part of a precharge value that precharges the one or more bitlines;
    a second precharge device that provides a remainder of the precharge value that precharges the one or more bitlines; and
    a lower power supply that supplies the first precharge device, and a higher power supply that supplies the second precharge device.

9. The SRAM device of claim 8, wherein the array of bit cells are connected to IO power supply.

10. The SRAM device of claim 8, wherein the one or more bitlines are selected by a column select line.

11. The SRAM device of claim 8, wherein the first precharge device remains off until the one or more wordlines are turned off, and then turns on before the second precharge device.

12. The system of claim 8, wherein the first precharge device and the second precharge device are comprised of MOSFETs.

13. The SRAM device of claim 8 further comprising a lower power supply that supplies the first precharge device, and a higher power supply that supplies the second precharge device.

14. The SRAM device of claim 8 implemented in a portable electronic device.

15. A method of precharging bitlines in SRAM memory device comprising:
    determining a precharge value to precharge bitlines in a bit cell array of the SRAM memory device;
    providing a first precharge value to a bitline of the bit cell array, wherein the first precharge value is less than the final precharge value and is associated with a first voltage supply; and
    applying second precharge value to the bitline to complete precharge of the bitlines, wherein the second is associated with a second voltage supply.

16. The method of claim 15, wherein the determining is made in consideration as to temperature, speed, and efficiency.

17. The method of claim 15, wherein the providing includes precharging all bitlines in the bit cell array.

18. The method of claim 15, wherein the second precharge value is derived from an existing bit cell array voltage.

19. The method of claim 15, wherein the first precharge value is derived from a power source that is less than a power source from which the second precharge value is derived.

20. The method of claims 15 further comprising determining a value for the first precharge value prior to applying the first precharge value.

* * * * *